(12) United States Patent
Banahan

(10) Patent No.: US 6,659,507 B2
(45) Date of Patent: Dec. 9, 2003

(54) ENHANCED SECURITY FOR TAMPER-APPARENT LABELS, SEALS OR TAGS

(75) Inventor: Michael Banahan, Montebello, NY (US)

(73) Assignee: American Bank Note Holographics, Inc., Elmsford, NY (US)

(*) Notice: Subject to any disclaimer, the term of this patent is extended or adjusted under 35 U.S.C. 154(b) by 0 days.

(21) Appl. No.: 09/824,526

(22) Filed: Apr. 2, 2001

(65) Prior Publication Data

US 2001/0035261 A1 Nov. 1, 2001

Related U.S. Application Data

(60) Provisional application No. 60/194,299, filed on Apr. 3, 2000.

(51) Int. Cl.[7] .............................................. B42D 15/00
(52) U.S. Cl. ........................... 283/81; 206/807; 283/94; 283/103; 428/42.1; 428/42.3; 428/43
(58) Field of Search ............................... 283/81, 82, 91, 283/92, 93, 94, 101, 103, 107, 109, 901; 206/807; 428/40.1, 41.7, 41.8, 42.1, 42.3, 43

(56) References Cited

U.S. PATENT DOCUMENTS

| | | | | |
|---|---|---|---|---|
| 4,403,827 A | * | 9/1983 | Bryan et al. | 427/166 |
| 5,447,335 A | * | 9/1995 | Haslop | 283/91 |
| 5,492,370 A | * | 2/1996 | Chatwin et al. | 283/110 |
| 5,757,521 A | * | 5/1998 | Walters et al. | 359/2 |
| 5,786,910 A | * | 7/1998 | Walters et al. | 359/2 |
| 5,830,529 A | * | 11/1998 | Ross | 427/152 |
| 5,851,615 A | * | 12/1998 | Kay | 428/40.1 |
| 6,361,889 B1 | * | 3/2002 | Hill | 428/201 |
| 6,372,341 B1 | * | 4/2002 | Jung et al. | 428/354 |
| 2001/0035261 A1 | * | 11/2001 | Banahan | 156/277 |

* cited by examiner

*Primary Examiner*—Monica Carter
(74) *Attorney, Agent, or Firm*—Fulbright & Jaworski LLP

(57) ABSTRACT

Tamper-apparent authenticating labels which comprise a protective film, an OVD image layer and a visually transparent ink pattern therebetween, to be applied to commercial articles. Authenticity of the label can be verified by viewing the taggant with a detector. The label reveals tampering when the film is separated from the article, causing separation of portions of the OVD under the ink. Also, methods for making tamper-apparent authenticity labels.

6 Claims, 3 Drawing Sheets

ENHANCED SECURITY FOR TAMPER-APPARENT LABELS, SEALS OR TAGS

CONTINUATION STATUS

This non-provisional application is a continuation of provisional Application Serial No.: 60/194,299, filed Apr. 3, 2000.

FIELD OF THE INVENTION

The present invention relates to methods for fabricating tamper-apparent and authenticating labels, seals and tags (hereafter "labels") for use in securing commercial items, such as electric meters, medicine bottles, compact discs, or any other items for which tamper apparency and authenticity is of value. The present invention also relates to tamper-apparent authenticating labels, seals and tags made by those methods.

BACKGROUND

Self-destructing labels are used to seal, protect and authenticate many commercial articles. The newest and most secure self-destructing labels are those which incorporate optically variable devices ("OVD's") including but not limited to diffraction gratings, exelgrams, kinegrams and/or holograms. A number of such labels are known, and are attachable to commercial articles by various means. For example, self-destructing labels can be hot-stamped or pressure-sensitive labels, with additional patterned adhesive underneath them.

If such a label is placed at the opening of a container, for instance a jewel case containing a compact disc, it is possible to tell if the product is genuine by viewing the OVD incorporated into the label sealing the jewel box. Removing the label causes the label to self-destruct into a pattern of smaller pieces. Thus, a counterfeiter cannot remove a genuine compact disc and place a counterfeit in the original package without the consumer becoming aware: the target customer of such a counterfeit compact disc will notice a missing or broken (self-destructed) label, and conclude that the compact disc's authenticity has been compromised.

Difficulties arise, however, if a sophisticated counterfeiter uses a counterfeit OVD label. In such cases, it may be difficult to tell, by simply looking at the product, if the OVD label is genuine. A method of testing for the genuine label comprises pulling the seal to determine if it self-destructs into patterned pieces. If there is such a patterned breakage, the tester knows the label was genuine. Unfortunately the tester also has ruined or at least lessened the value of the labelled product. In the example above, even if the genuine compact disc can be recycled back to the manufacturer for repackaging with a new label, significant value has been destroyed.

SUMMARY OF THE INVENTION

The present invention provides an efficient and cost-effective enhancement of such tamper-apparent authenticity labels. The improvement lies in (i) allowing the inspection of self-destruct labels without actually causing them to self-destruct, and (ii) permitting the controlled, patterned self-destruction of the label incorporated the OVD. As metioned in the Background section, "OVD" includes, but is not limited to, diffraction gratings, exelgrams, kinegrams and/or holograms.

The security label of the present invention includes an outer film layer (i.e., the layer closest to the consumer and furthest from the article being sealed and authenticated) above an OVD-containing layer. An "ink" is printed below the outermost film layer but above the OVD-containing layer. The ink, containing a fluorescent taggant, is printed in a pattern, visible under ultraviolet light, but virtually invisible to the unaided eye. By shining an ultraviolet light on the seal, an inspector can determine whether the OVD label is genuine or counterfeit. The appearance of a fluorescent pattern confirms authenticity, while the absence of a fluorescent pattern leads the inspector to question authenticity.

Moreover, simply printing the fluorescent ink above the film layer will not circumvent this security feature. This is because the fluorescent ink lies below the film layer of the label, and there is no printed ink above the surface of the label. Accordingly, an inspector can determine, by scratching the surface of the label, if someone has attempted to approximate the fluorescent pattern in the genuine label by printing fluorescent ink above the surface of the label.

Importantly, a counterfeiter also cannot simply peel back the film layer of the label and then print fluorescent ink, as this would cause the label to self-destruct. This is due to a further security feature of the invention: the ink's taggant is mixed with an oligomer which causes the ink to be releasable. The film layer binds to the ink and, where there is no ink (i.e., the "spaces" in the ink pattern), to the OVD-containing layer. Separating the film from the article causes the ink also to be separated, and also causes those portions of the OVD layer contacting the film (at the pattern's spaces) to be separated. The portions of the OVD layer contacting the ink, but not the film, are "released" by the ink and thus not separated. Once separation occurs, the film cannot be re-adhered to the article. Further, because only those portions of the OVD layer in contact with the film are separated, the OVD image will self-destruct in a pattern substantially identical to the printed pattern. A separated label, and thus a compromised article, is easily detectable by the pattern broken OVD images and the non-adhesion of the film to the article.

Various other objects of the present inventions will become readily apparent from the ensuing detailed description and drawings.

DETAILED DESCRIPTION OF THE EMBODIMENTS

The following detailed description, given by way of example and not intended to limit the present invention solely thereto, will be best be understood in conjunction with the accompanying drawings, FIGS. 1–4.

Figure 1:
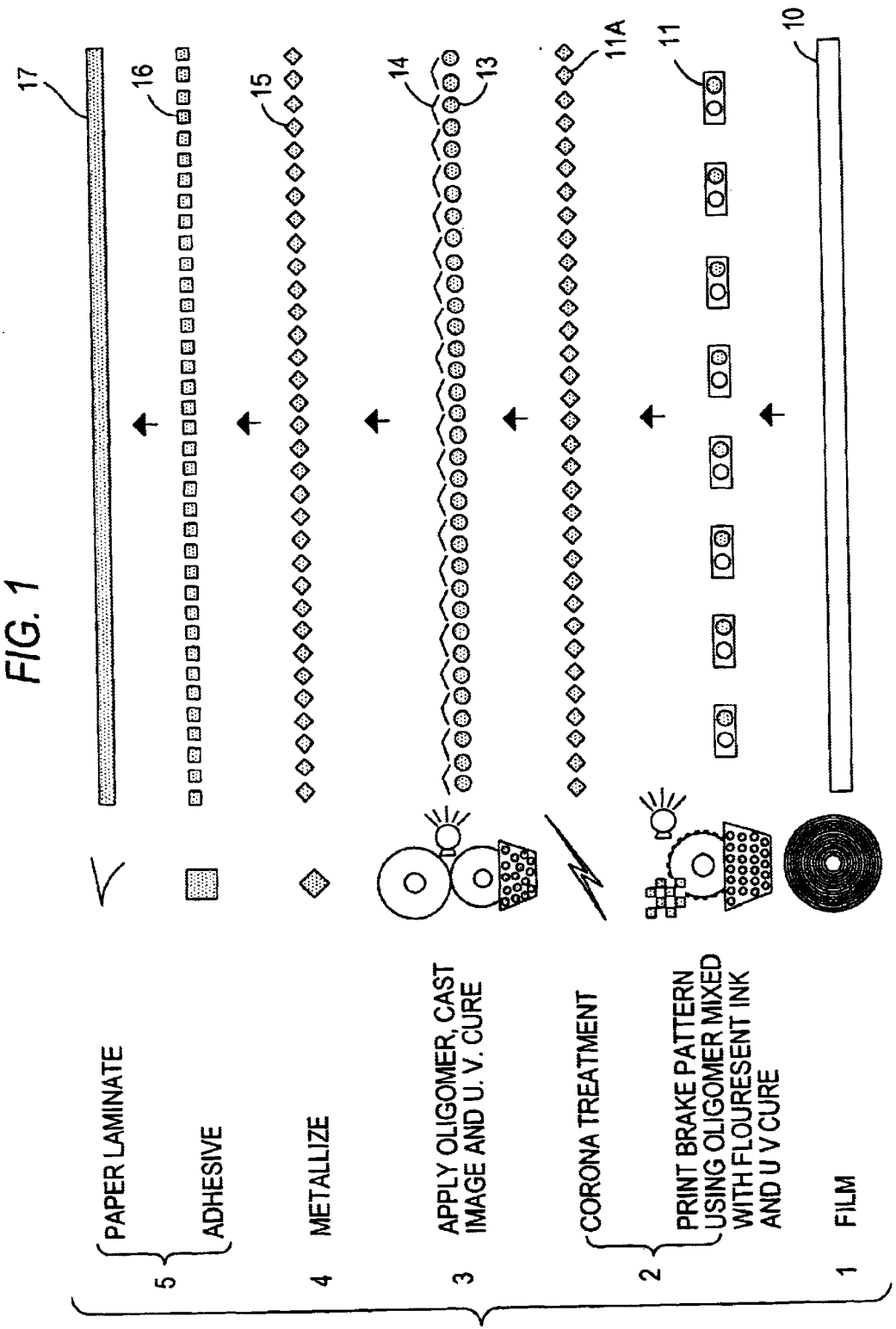
FIG. 1 is a schematic depiction of a method according to the present invention for fabricating a tamper-apparent authenticating label.

Referring to FIG. 1, a transparent film (10) is provided in step 1. The film is typically polyester, and usually, but not necessarily, has received a treatment to increase its receptivity to ink or inks. The film need not be polyester, but can be any transparent film having the appropriate properties.

In step 2, a pattern of an oligomer mixed with a taggant (hereafter, "ink" (11)) is applied to the film. The taggant component of the ink is a visibly transparent ink or other taggant. Most typically, the taggant is fluorescent and substantially invisible or transparent to the unaided eye under visible light, but viewable under ultraviolet light. However, it is appreciated that the present invention is not limited to an ultraviolet fluorescent taggant. Any clear taggant may be used as long as it is substantially invisible to the unaided eye but visible using a detector, inducting but not limited to an electrical IR or ultraviolet detector or the like.

The oligomer component may be any of a number of commercially available oligomers. It is recognized that the taggant may also be mixed with a substance other than an oligomer so long as that substance is capable of binding to the film layer while permitting a "clean" separation from the OVD image.

The ink (taggant mixed with oligomer) must be sufficiently clear to transmit reflected light so as not to significantly diminish the reflected image of the OVD.

In another embodiment of the label of the present invention, fluorescent taggants of different colors (i.e., red, white, blue and green) can be used to differentiate sophisticated OVD labels which, to the unaided eye, appear identical. A company could use one color for export, for example, and another color for national distribution, allowing the company to keep tabs on "gray market" goods.

The ink pattern is typically several microns thick, but can be thicker. Generally the pattern takes the form of a checkerboard (12) and covers approximately half of the surface area of the film. Accordingly, the completed label will show a checkerboard pattern when illuminated with an ultraviolet light, allowing the authenticity of the label to be verified without destroying the label. It is recognized that the present invention is not limited to a checkerboard pattern, and the pattern can be a bar code, a trademark or any other image visible under ultraviolet light or similar detector.

In some cases, it is advisable to apply a "corona" treatment (11A) to the film after the application of the ink. The corona treatment tends to improve the releaseability of the image layer (13) (described more fully below) from the ink (11), while also improving the adherence of the image layer to the film (10).

In a third step, a coating of oligomer or similar imageable material (13) is applied to the film, now containing the ink pattern, to form an image layer. By "imageable material" it is meant any material capable of receiving an OVD image by casting, embossing, or any other process. An optically variable image (14) is then created on the oligomer image layer, typically by embossing or casting. If warranted, the image is then cured, typically using ultraviolet light or an electron beam.

In step 4, a reflective sub-layer (15) is applied to the oligomer. Often this is accomplished by metallizing the image layer, typically by a vapor desposited metal (15).

In a fifth step, the imaged surface of the film receives an adhesive coating (16) and then a release liner (17). Typically, the release liner is a wax coated paper laminate. The adhesive may be a heat-activated adhesive or a pressure-sensitive adhesive, or any other form of adhesive, the choice of adhesive depending upon how the label is to be attached to the article and the nature of the article itself.

Figure 4A:
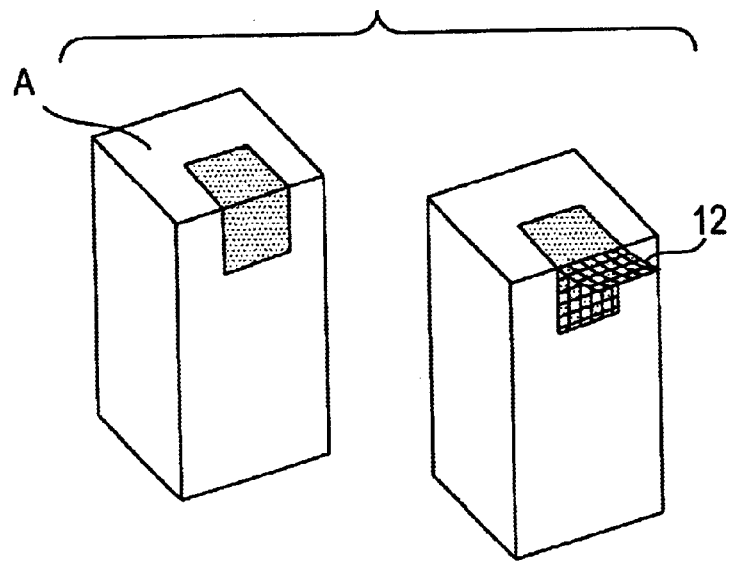
FIG. 4A is a perspective view of the label on a commercial article following separation of the film layer.

In a final step, and usually after die cutting the label to an appropriate size and shape, the release liner (17) is removed and the label is attached via the adhesive (16) to the article (A) being authenticated and/or secured, i.e., an electric meter, a medicine bottle, a compact disc, or the like as shown in FIG. 4A. It is noted that the article need not necessarily be a commercial article, but could be any article requiring security, such as containers for medical or government records, personal or business correspondence, to name a few examples.

Figure 2:
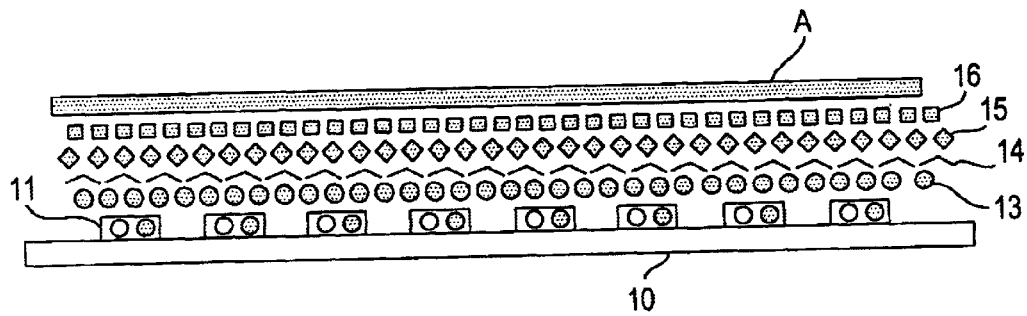
FIG. 2 is a schematic cross-section view of the label of the present invention prior to separation of the film layer.

The method described in FIG. 1 results in the label of FIG. 2, which is shown attached to an article (A) with the release liner (17) removed.

Figure 3:
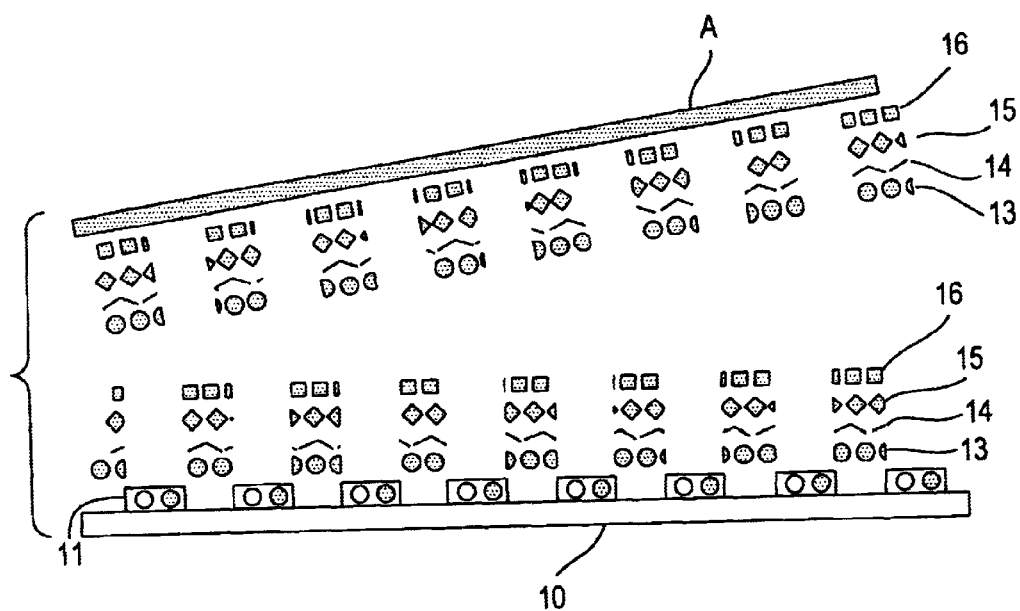
FIG. 3 is a schematic cross-section view of the label of the present invention following separation of the film layer.

FIG. 3 shows the label following separation of the film (10) layer from the surface of the article (A) being secured, such separation being caused by tampering, or by normal use by the consumer. As is shown, the ink and portions of the oligomer image and metal layers in direct contact with the film (10) (i.e., not directly above the ink) are removed from the surface of the commercial article (A) upon the separation of the film. In contrast, those portions of the oligomer image and metal layers which are directly above (in contact with) the ink layer remain on the article. These portions "break" or are "released" from the ink layer, and are not pulled way from the article along with the film.

Figure 4B:
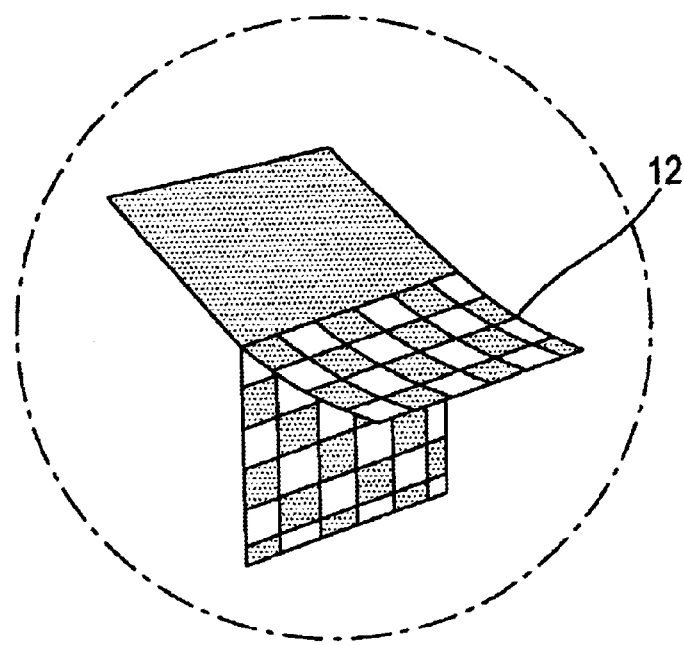
FIG. 4B is a close-up view of the partially separated label in FIG. 4A.

FIGS. 4A and 4B show a visible checkerboard pattern (12) formed by the separation of the film layer (10) from the article (A).

While the present invention has been particularly described with respect to the illustrated embodiment, it will be appreciated that various alterations, modifications and adaptations may be made on the present disclosure, and are intended to be within the scope of the present invention. It is intended that the appended claims be interpreted as including the embodiment discussed above, those various alternatives, which have been described, and all equivalents thereto.

What is claimed:

1. A tamper-apparent device, comprising:

a clear protective layer having opposed surfaces;

a thin patterned layer of radiation cast resin, said radiation cast resin cast onto one surface of the protective layer such that some portions of said one surface of the protective layer are covered by the patterned layer, and other portions of said one surface of said protective layer are not covered by the patterned layer;

a radiation cast holographic image layer cast onto said patterned layer and the portions of said one surface of said protective layer that are not covered by said patterned layer;

a strongly attached reflective layer attached to said holographic image layer; and an adhesive layer attached to said reflective layer for affixing the device to a substrate; and wherein said holographic image layer bonds more strongly to the non-covered portions of said one surface of said protective layer than said patterned layer such that when said protective layer is separated from said device said holographic image layer cast onto said patterned layer breaks from said patterned layer to form a break pattern of said holographic image layer.

2. The tamper-apparent device of claim 1, wherein said patterned layer of radiation cast resin comprises ultraviolet fluorescing die or pigment.

3. The tamper-apparent device of claim 1, wherein said patterned layer of radiation cast resin comprises infrared fluorescing die or pigment.

4. The tamper-apparent device of claim 1, wherein said protective layer and said patterned layer are subject to corona treatment to improve releaseability of said holographic image layer from said patterned layer.

5. The tamper-apparent device of claim 2, wherein said patterned layer forms a pattern that is visible under an ultraviolet light source, thereby enabling the authenticity of the device to be verified without destroying the device.

6. The tamper-apparent device of claim 3, wherein said patterned layer forms a pattern that is visible under an infrared light source, thereby enabling the authenticity of the device to be verified without destroying the device.

* * * * *